United States Patent
Skindhøj et al.

(10) Patent No.: US 7,011,985 B2
(45) Date of Patent: Mar. 14, 2006

(54) METHOD FOR PRODUCING MINIATURE AMPLIFIER AND SIGNAL PROCESSING UNIT

(75) Inventors: Jørgen Skindhøj, Hellerup (DK); Anders Erik Petersen, Hellerup (DK)

(73) Assignee: Oticon A/S, Hellerup (DK)

( * ) Notice: Subject to any disclaimer, the term of this patent is extended or adjusted under 35 U.S.C. 154(b) by 168 days.

(21) Appl. No.: 10/484,246

(22) PCT Filed: Jun. 14, 2002

(86) PCT No.: PCT/DK02/00402

§ 371 (c)(1),
(2), (4) Date: Feb. 12, 2004

(87) PCT Pub. No.: WO02/103784

PCT Pub. Date: Dec. 27, 2002

(65) Prior Publication Data

US 2004/0235218 A1    Nov. 25, 2004

(30) Foreign Application Priority Data

Jun. 16, 2001    (DK) ................................ 2001 00942

(51) Int. Cl.
*H01L 21/44* (2006.01)

(52) U.S. Cl. ........................ 438/106; 438/125; 438/127

(58) Field of Classification Search ................ 438/106, 438/125, 127, 107

See application file for complete search history.

(56) References Cited

U.S. PATENT DOCUMENTS

| 6,338,980 | B1 |   | 1/2002 | Satoh |   |
|---|---|---|---|---|---|
| 6,787,398 | B1 | * | 9/2004 | Tateoka et al. | 438/125 |
| 6,916,719 | B1 | * | 7/2005 | Knight et al. | 438/381 |
| 2004/0235218 | A1 | * | 11/2004 | Skindhoj et al. | 438/106 |

FOREIGN PATENT DOCUMENTS

WO    WO 2103784 A1 * 12/2002

OTHER PUBLICATIONS

Patent Abstracts of Japan, of JP 2001-127206, published May 11, 2001, entitled "Manufacturing Method of Chip-Scale Package and Manufacturing Method of IC Chip" to Sato Tetsuo (Citizen Watch Co., Ltd.).

* cited by examiner

*Primary Examiner*—Laura M. Schillinger
(74) *Attorney, Agent, or Firm*—Dykema Gossett PLLC

(57) ABSTRACT

A method for producing miniature amplifier and signal processing unit includes the steps of:
  producing arrays of individual integrated circuits on a side of a wafer, where each circuit has a number of I/O connection points;
  providing a number of solder connection pads at each integrated circuit for redistribution of the I/O connection points of the integrated circuit;
  coating the side of the wafer having the solder connection pads with a protection coating and ensuing through going apertures in the coating to provide electrical contact with the solder connection pads;
  applying electrical components onto the coating and gaining electrical contact with the solder connection pads through the apertures of the coating material; and
  singulating the individual amplifiers from the wafer and ensuring light protection of the edges and possible unprotected side of the amplifiers.

12 Claims, 4 Drawing Sheets

METHOD FOR PRODUCING MINIATURE AMPLIFIER AND SIGNAL PROCESSING UNIT

AREA OF THE INVENTION

Integrated circuits (IC) are used in numerous electronic devices. One example of such a device is hearing aids wherein the integrated circuits are used for signal processing and amplification. The invention is especially relevant in connection with hearing aids, due to the required small size of these, but the invention is also relevant in any small size electronic device, in which speedy signal processing is required.

Integrated circuits are produced on large silicon wafers and singulated before they are connected to a printed circuit board (PCB), usually by wire bonding from connection pads along the edge of the IC.

In resent years a new process has been developed, in which a redistribution layer is applied to the surface of the IC, and an area array of solder bumps (ball grid array or BGA) is attached to the surface redistribution layer. These processes may be performed at the wafer level, and followed by singulation, and in some cases encapsulation for protection purposes. After singulation, the chip may be inverted, placed at a PCB, and by heating be attached through the BGA to the circuit board. Thereby the wire bonding can be omitted. Also it is known to stack various IC components using the BGA on one or both sides of the chips to gain connection between the stacked components.

BACKGROUND OF THE INVENTION

Usually IC's are mounted on printed circuit boards and gains contact with in and output signals and further electric components through the circuits on the circuit board. The circuit board is space-consuming, and further the processes used to connect the IC to the circuits on the board requires multiple steps which all must be free of errors. Safe methods have been developed like the mentioned direct connection through a BGA, but long process times are still required. Further the voluminous printed circuit board is a major problem especially in hearing aids and similar electronic devices. In U.S. Pat. No. 5,563,084 a method of making a three dimensionally integrated circuit is disclosed. First and second substrates are provided with devices in at least one layer in at least one surface each. An auxiliary substrate is connected to the one surface of the substrates, which is then reduced in thickness from its opposite surface. The auxiliary layer with the devices thereon is then separated into individual chips, which after having been found to be functioning are aligned and mounted in a side-by-side arrangement on the one surface of the first substrate. Electrical connections are formed between the devices of the mounted chips and the devices in the first substrate. The document does not disclose any way of protecting the individual dice in a wafer level process.

U.S. Pat. No. 6,235,141 discloses a mass production method for integrated optical subsystems. The invention concerns the alignement of singular dies with the dies in a wafer and subsequent bonding of the singular dies with the wafer. Following this the dies are diced to form a bonded pair of dies containing at least one optical element. The document does not disclose any way of protecting the individual dice in a wafer level process.

U.S. Pat. No. 6,177,295 discloses a method for forming individual semiconductor devices by sandwiching a wafer with semiconductor elements on a first side thereon between two glass plates. The devices are diced by sawing.

The object of the invention is to provide a method of producing a signal processing unit comprising an IC, which is faster and less prone to errors, and which is ready for use without the need of an underlying circuit board. In the following the signal processing unit is referred to as an amplifier, but any type of signal processing may take place in the unit.

SUMMARY OF THE INVENTION

The objective is achieved with the method according to claim 1 by producing the miniature amplifier and signal-processing unit using the following steps:
producing arrays of integrated circuits on a side of a wafer, where each circuit has a number of I/O connection points,
providing a number of solder connection pads at each integrated circuit for redistribution of the I/O connection of the integrated circuit,
coating the side or sides of the wafer having the solder connection pads with a protection material and ensuing through going apertures in the coating to provide electrical contact with the solder connection pads,
applying electrical components onto the coating and gaining electrical contact with the solder connection pads through the apertures of the coating material,
singulating the individual amplifiers from the wafer by providing furrows along the edges of each amplifier through the thickness of the wafer and
ensuring protection of the edges and possible unprotected side of the amplifiers while the individual amplifiers remain fastened to the carrier layer.

Once an individual amplifier is singulated from the entire wafer, and the protection of edges and possible unprotected side is ensured, the amplifier is ready for use in a hearing aid or similar device. No mounting of the IC on a PCB is necessary, as the further electronic components required to produce the output signal from the amplifier are mounted on the surface or surfaces of each amplifier before singulation from the wafer. The formation of the furrows for the singulation may take place in any known manner eg. by sawing. Wires may be soldered directly to the solder connection pads for input and output signals and for current supply. The method according to claim 1 is both time saving and results in fewer errors, as the number of electric connections which must be established, is reduced. Further, handling of the individual amplifiers after singulation is avoided, as singulation and coating for light and environmental protection is the last process the amplifiers are going through before mounting in the instrument in which they are to function.

In a further embodiment of the method the following steps are performed:
embedding a first side of the wafer in a polymer substance,
providing a carrier layer to the polymer substance and hardening the polymer substance such that each amplifier is retained embedded in the polymer substance and attached to the carrier,
singulating the amplifiers from the opposite side of said first side of the wafer.

If components are mounted on the first side of the wafer, they should be protected during singulation and this is done by embedding the components in a polymer substance, which will harden into an elastic layer, wherefrom the amplifiers at a later stage may be peeled of. If no components are present on the first side, the polymer substance acts primarily as an adhesive, which retains the wafer on the carrier layer. The polymer substance is also known as sawing glue.

For handling purposes the carrier layer, preferably a rigid layer is provided at the polymer substance, such that the wafer in effect is glued to the carrier layer by the polymer substance. If components are only present at the first side of the wafer, the wafer may at this stage be thinned down by well-known back labbing methods. The advantage is that the rigid carrier layer facilitates handling and holding of the wafer during this operation. However if the chip has its final thickness no backlabbing will take place.

After singulation of the amplifiers, they will still be attached to the carrier layer for subsequent operations, but they are easily peeled of.

In an embodiment of the invention the singulation of the amplifiers is accomplished by means of V shaped furrows through the thickness of the wafer provided along the edge of each amplifier. A conventional saw easily provides the V shaped furrows, preferably a round saw. But other alternatives are known such as etching techniques ore laser cutting. The V shape of the furrows makes subsequent coating of the side edges of the amplifiers easy.

In an embodiment the protection of the edges and possible unprotected side of the amplifiers is accomplished by applying a protection layer to the amplifiers. As the individual amplifiers are still attached to the carrier layer, all the amplifiers of a whole wafer may be treated simultaneously and a uniform protection layer may be accomplished. The protection layer protects the IC of the amplifier from light and other harmful environmental influences. The individual handling of the amplifiers during this delicate process is avoided.

Preferably the protection layer is provided by metalization of the amplifiers. In the case, where electric components are also attached to the back of the wafer, the metalization layer should only cover the edges of the amplifiers. The use of metalization layers results in very dens and durable protection layers.

In a further embodiment of the invention two or more carrier and/or information layers are applied to a first side of the wafer prior to singulation. Singulation is then carried out from the opposite side of the said first side of the wafer, and such that at least one information layer is severed along the edges of each amplifier, and such that the individual amplifiers are retained on at least one un-severed carrier layer. The information layer, which is severed, remains with the individual amplifier. The un-severed carrier layer serves to keep the amplifiers of the entire wafer together for further handling and treatment. After further treatment the individual amplifiers may be peeled away from the carrier layer. The information layer which stayes with the amplifier is preferably a printed label, where the carrier layer may comprise a sheet material or a sawing glue attached to the carrier plate.

In the case, where electrical components are present at the first side of the wafer, the space between the components is filled with a suitable filler to produce a plane surface before the carrier and/or information layers are applied.

Preferably the severed information layers is light protecting, and carries information concerning the identity of each amplifier.

Preferably the carrier layer carrying the amplifiers is an elastic layer, and said layer is stretched prior to coating the edges of the individual amplifiers. By this stretching action the space between the individual amplifiers is increased and more space is given for the coating of the edges of the amplifiers.

In an embodiment the protection layer for the edges is provided by filling op the furrows with a fluent or semifluent substance, hardening the substance, providing a furrow between adjacent amplifiers leaving the hardened substance attached to the edges of each amplifier. This embodiment provides an even and dense protection layer at all edges of the amplifier.

The method according to the invention may be used for producing amplifieres, wherein the solder connection pads and electrical components are provided on both sides of the wafer, and where through going apertures in the wafer are used to allow the I/O connections of the integrated circuit to gain contact with the solder connections on the opposite side of the wafer. The through going apertures must be provided at areas outside the area of the integrated circuit, but at the same time such that apertures are located within the perimeter and/or at the rim of each single amplifier.

DESCRIPTION OF A PREFERRED EMBODIMENT

Figure 1:
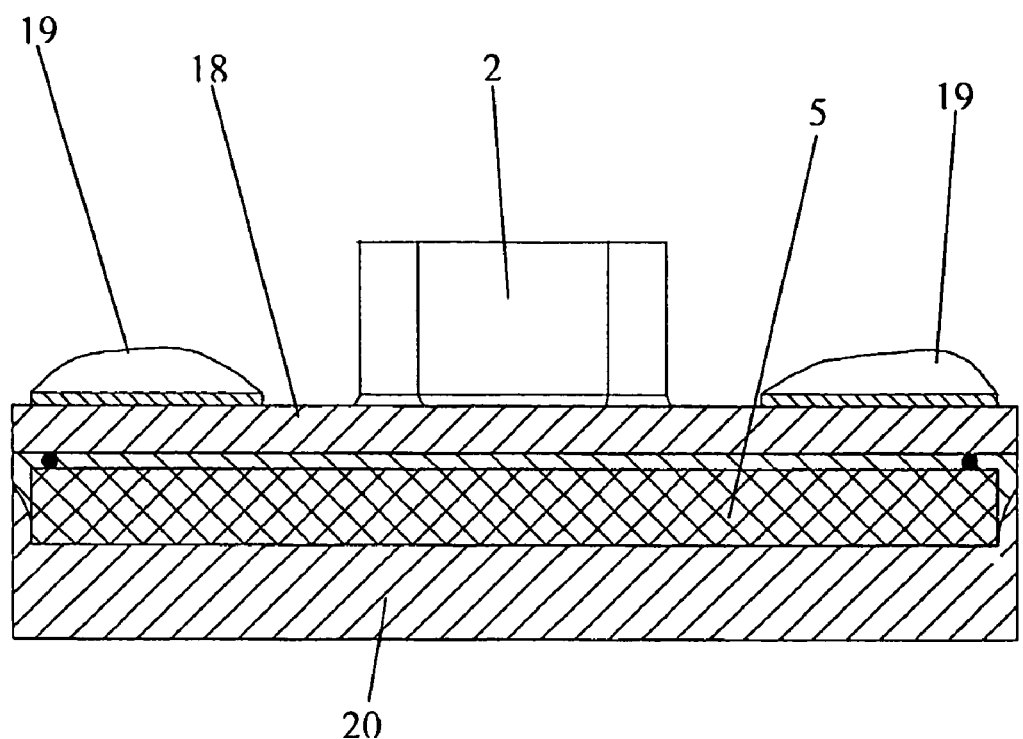
FIG. 1 is a sectional view of an amplifier according to the prior art.

The amplifier in FIG. 1 comprises an integrated circuit 5 and a number of other electronic components 2 like resistors, capacitors or coils (only one component is shown). The integrated circuit 5 is mounted on a substrate 18, like alimina ceramic, or pcb and bonded to the substrate 18. The substrate 18 has vias (not shown) such that the connection points of the IC 5 gain contact with printed leads on the opposite side of the substrate 18. On the substrate 18 the other electronic components 2 are surface mounted and soldered to gain contact with the printed leads and through the vias to the IC 5. Also solder bumps 19 are provided for input, output and power supply for the amplifier 5. A chipcoat 20 is arranged on top and sides of the chip 5 for protection purposes.

Figure 2:
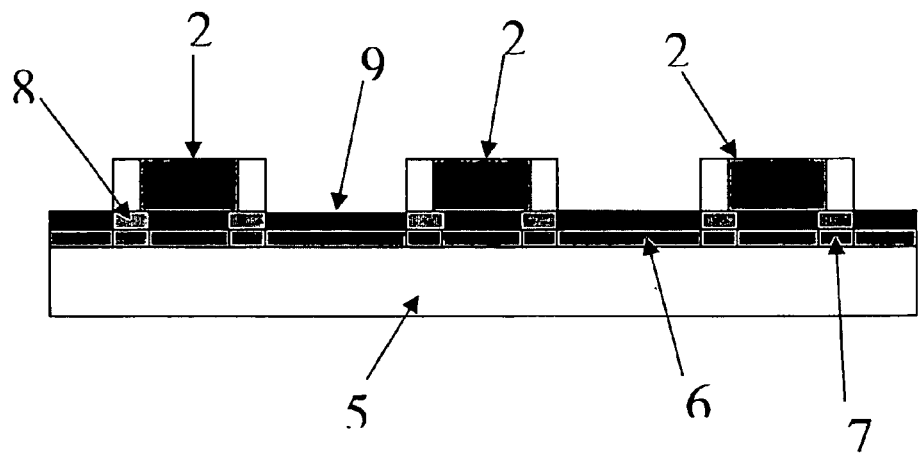
FIG. 2 is a sectional view of an amplifier according to a first embodiment of the invention before singulation.

In FIG. 2 a section through a wafer 5 which has a number of integrated circuits on the topside is shown. The integrated circuits are arranged in a two-dimensional array as usual, and in FIG. 2 three of the integrated circuits of the wafer are shown. On top of the integrated circuits bonding pads (not shown) are provided, and through a redistribution layer 6 the bonding pads gain contact with soldering bumps 7. The integrated circuit under the redistribution layer must be protected from light and other harmful environmental influences. To do this a protection layer 9 is provided over the redistribution layer 6. The protection layer has apertures over the soldering bumps 7, and by filling the apertures with a suitable soldering material 8, connection to the soldering bumps 7 is achieved through the apertures. The protection layer must as a minimum requirement protect the IC from light.

Having established the protection layer and the soldering material 8 over the soldering bumps 7, electronic components 2 are laid out on each integrated circuit of the wafer. The connection to the terminals of the components is established through heating whereby the soldering material melts. Further soldering points (not shown) for input, output and current supply are provided on each IC of the wafer.

Figure 3:
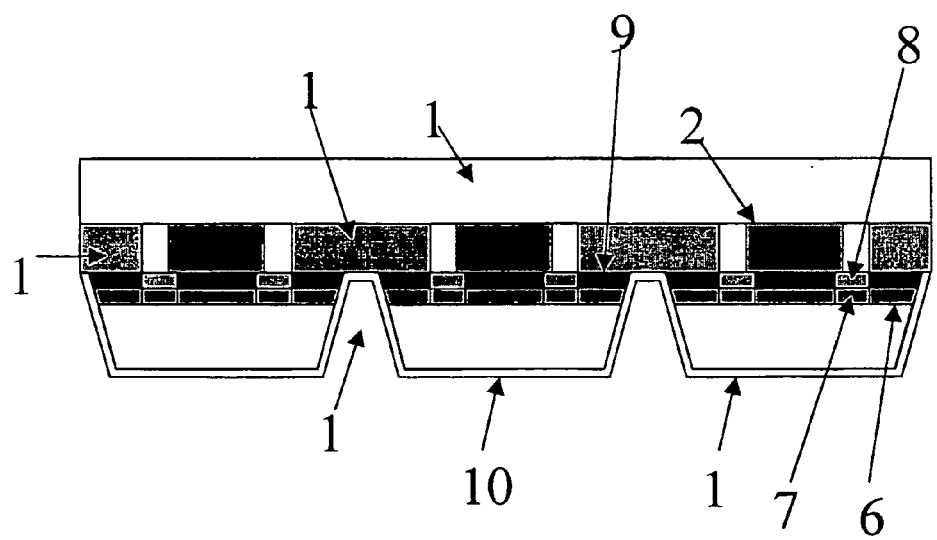
FIG. 3 is a sectional view of an amplifier according to a first embodiment being prepared for singulation.

FIG. 3 shows the three amplifiers of FIG. 2 after singulation and after a protection layer 10 has been applied. Prior to the singulation, the components 2 shown on the topside of the wafer are embedded in a polymer substance 11 such as a pealable solder mask. On top of the polymer substance 11 a carrier layer 12 is applied. The polymer substance is left to cure or solidify, which creates a firm bond between the wafer and the carrier layer 12. The amplifiers may now be singulated, but will stay in their position on the carrier layer 12. Preferably a rigid carrier layer 12 is chosen. This technique may be used also if there are no components mounted on the topside of the wafer. In this case the polymer substance 11 serves only to retain the amplifiers on the carrier layer 12 during and after singulation.

The singulation may be performed in any known manner, and according to the invention a round saw having a blade with a V shaped profile is used. Thereby V shaped furrows 13 are created between the individual amplifiers. The V shaped furrows are preferably employed when the singulation takes place from the side opposite the side having the integrated circuit.

The amplifiers shown in FIG. 3 may also have components mounted on the side opposite the side having the integrated circuit. In this case this side has a redistribution layer and a light protection layer corresponding to the layers provided on the top of the integrated circuit. Also connections through the wafer must be provided to allow connection between the redistribution layer on the opposite side and the integrated circuit. If components are mounted on both sides the light protection layer 10 is only applied to the edges of the individual amplifiers.

After singulation the entire carrier layer 12 having all amplifiers of the wafer is fed to a workstation for application of a light protection layer 10. This layer is preferably a metal layer, but other types of layers are possible. When the light protection layer is applied, the individual amplifiers may be peeled of the carrier layer 12, leaving the polymer substance 11 adhered at the carrier layer 12. The light protection layer interconnects adjacent amplifiers at the bottom of the furrows, but as this layer is thin, it will brake when the amplifiers are peeled of the carrier layer.

Figure 4:
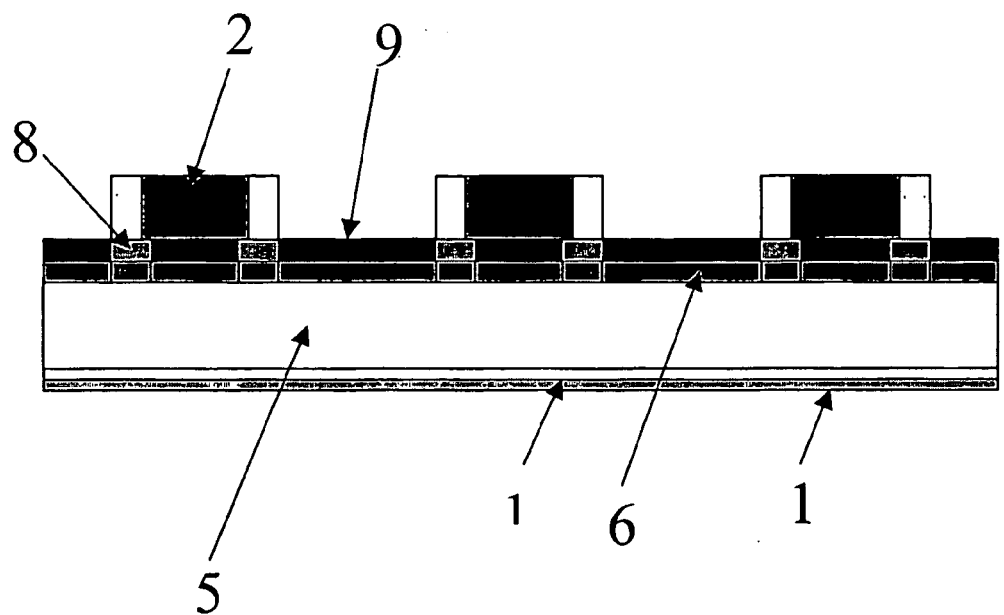
FIG. 4 is a sectional view of an amplifier according to a second embodiment of the invention being prepared for singulation.
Figure 5:
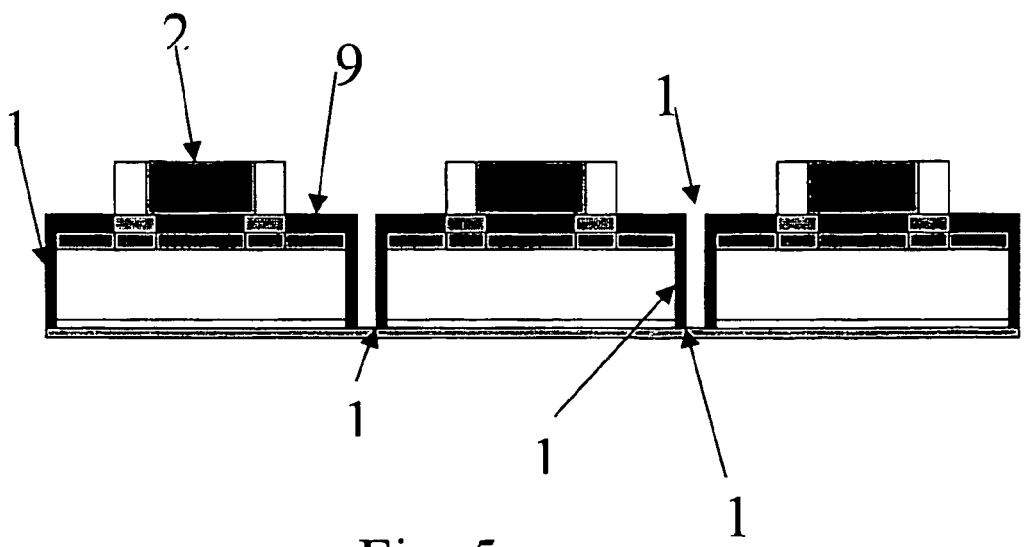
FIG. 5 is a sectional view of the amplifier of FIG. 4 after singulation.

In another embodiment of the invention shown in FIGS. 4 and 5 the singulation of the wafers is accomplished after applicaton of an information layer 14 and a carrier layer 15. During the singulation the information layer 14 is severed, whereas the carrier layer stays intact. If singulation takes place from the side of the wafer having the integrated circuit, V shaped furrows cannot be used as in the previous example, (see FIG. 3) but straight furrows must be used as shown in FIG. 5. This is because the integrated circuits are produced on the wafer with a minimum of space there between. However if the singulation takes place from the side opposite the side of the integrated circuit, a V shaped furrow may be used for the singulation.

The singulated amplifiers are treated at the edges 18 by a protection layer 17 as shown in FIG. 5. In FIGS. 4 and 5 no electrical components are shown at the side whereto the information and carrier layers 14,15 are applied, but components may be present, and in this case a filler is introduced between the component. The filler is used to provide a uniform and even surface, whereto the information and carrier layers 14,15 may be applied. The filler is preferably a polymer which may be applied in fluid or semifluid state, and which is left to cure, before application of the information and carrier layers 14, 15. The information layer 14 should be light and environmentally protecting if the layer 14 is applied directly to the surface of the wafer as shown in FIGS. 4 and 5. Thereby the necessary protection of the wafer is provided. The information layer 14 is preferably a pre-printed label, which carries information identifying each amplifier.

The carrier layer 15 could be any coherent substance, which will keep the singulated amplifiers together for subsequent treatment. A rigid plate could be used and in this case an adhesive must be introduced between the carrier 15 layer and the information layer 14. In one embodiment the carrier layer 15 is a flexible sheet whereto the amplifiers are adhered. Such a flexible sheet may be stretched to some extend, and this will provide more space 16 between the individual amplifiers for application of the light protection layer 17 to the edges 18 of the amplifiers.

The carrier layer 12 of the embodiment according to FIG. 3 and the carrier layer 15 according to FIG. 4 may look different, but in fact they serve the same overall purpose, namely to retain all of the amplifiers of the wafer attached and together during the singulation and during subsequent processing such as applying light protection coating to the edges of the amplifiers.

Figure 6:
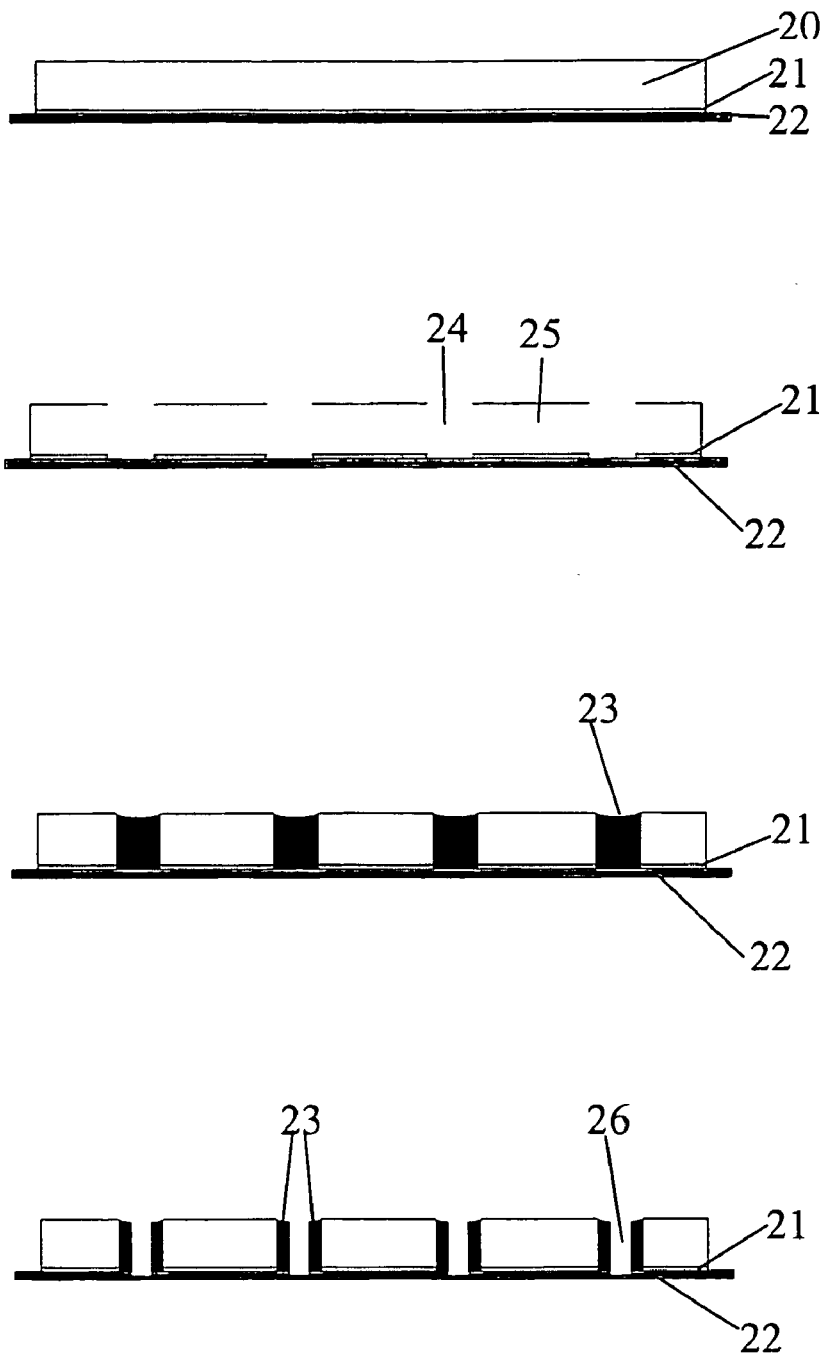
FIG. 6 displays four steps of the protection and singulation according to a further embodiment of the invention.

In the embodiment according to FIG. 6 four steps in the process of protection and singulation a, b, c and d are shown. At a, the wafer 20 is supplied with a label 21 and fastened at the label side in a sawing glue 22. Following this the individual amplifiers 25 are singulated using standard sawing techniques but such that the label 21 is also cut.

This creates furrows 24 between all amplifiers 25 and they are now maintained in position by their adhesion to the sawing glue 22. The width of the furrows 24 corresponds to the width of the saw-blade used. This is shown at b. At c it is shown how the furrows 24 between the amplifiers 25 is filled with a light protecting material 23. The material 23 is dispensed into the furrows in a fluid or semi-fluid state, and subsequently hardens or solidifies. In the last processing step shown at d the furrows are now cut open once again, but this time using a saw with a smaller width. This provides new furrows 26 between the amplifiers 25, and at the same time leaves light protecting material 23 at the edges of each amplifier 25. The individual amplifies can now be peeled off the sawing glue and are now ready for use in an apparatus. The front side is provided with components and solder bumps as described previously, (not shown in FIG. 6) and has a lightprotecting layer, the back side is provided with the light protecting label 21, and the sides or edges are covered with the light protecting material 23. All processes have taken place at wafer level.

What is claimed is:

1. A method for producing miniature amplifier and signal processing unit comprising the steps of:
    producing arrays of individual integrated circuits on a side of a wafer (5), where each circuit has a number of I/O connection points;
    providing a number of solder connection pads (7) at each integrated circuit for redistribution of the I/O connection points of the integrated circuit;

coating the side of the wafer having the solder connection pads (7) with a coating of protection material (9) and ensuing through going apertures (8) in the coating to provide electrical contact with the solder connection pads (7);

applying electrical components (2) onto the coating and gaining electrical contact with the solder connection pads (7) through the apertures (8) of the coating material (9);

fastening the wafer (5) to a carrier layer, singulating the individual amplifiers from the wafer (5) by providing furrows along the edges of each amplifier through the thickness of the wafer and ensuring protection of the edges of the amplifiers while individual amplifiers remain fastened to the carrier layer.

2. Method according to claim 1, wherein the following steps are performed:

embedding a first side of the wafer (5) in a polymer substance (11);

providing the carrier layer (12) to the polymer substance (11) and hardening the polymer substance (11) such that each amplifier is retained embedded in the polymer substance (11) and attached to the carrier layer (12);

singulating the amplifiers from the opposite side of said first side of the wafer.

3. Method according to claim 2, wherein the singulation of the amplifiers is accomplished by means of v shaped furrows (13) through the thickness of the wafer (5) provided along the edge of each amplifier.

4. Method according to claim 2, wherein the protection of the edges and possible unprotected side of the amplifiers is accomplished by applying a protection layer (10) to the amplifiers.

5. Method according to claim 4, wherein the protection layer (10) is provided by metalization of the amplifiers.

6. Method according to claim 1, wherein two or more carrier and/or information layers (14;15) are applied to a first side of the wafer (5) prior to singulation, and wherein singulation is carried out from the opposite side of said first side by providing furrows through the thickness of the wafer, and such that at least one information layer (14) is severed along the edges of each amplifier, and such that the individual amplifiers are retained on at least one un-servered carrierlayer (15).

7. Method according to claim 6, wherein electrical components are present at the first side of the amplifiers, and wherein the space between the components is filled with a filler material to produce a plane surface prior to application of the carrier and/or information layers (14; 15) to the first side of the wafer (5).

8. Method according to claim 6, wherein the severed information layer (14) is light protecting, and carries information concerning the identity of each amplifier.

9. Method according to claim 8, wherein the carrier layer (15) carrying the amplifiers is an elastic layer, and that said layer (15) is stretched prior to coating the edges (19) of the individual amplifiers.

10. Method according to claim 4, wherein the protection layer is provided by: filling up the furrows with a fluent or semi-fluent substance, hardening the substance, providing a furrow between adjacent amplifiers leaving the hardened substance attached to the edges of each amplifier.

11. Method according to claim 9, wherein the amplifiers are peeled off the carrier layer (15) after singulation and coating.

12. Method according to claim 1, wherein the solder connection pads (8) and electrical components (2) are provided on both sides of the wafer (5), and that through going apertures are used to allow the I/O connections of the integrated circuit to gain contact with the solder connection on the opposite side of the wafer (5).

* * * * *